United States Patent
Mahler

(10) Patent No.: US 10,253,415 B2
(45) Date of Patent: Apr. 9, 2019

(54) PROCESS FOR THE THICKNESS GROWTH OF COLLOIDAL NANOSHEETS AND MATERIALS COMPOSED OF SAID NANOSHEETS

(71) Applicant: NEXDOT, Paris (FR)

(72) Inventor: Benoit Mahler, Paris (FR)

(73) Assignee: NEXDOT, Romainville (FR)

( * ) Notice: Subject to any disclaimer, the term of this patent is extended or adjusted under 35 U.S.C. 154(b) by 266 days.

(21) Appl. No.: 14/352,887

(22) PCT Filed: Oct. 19, 2012

(86) PCT No.: PCT/FR2012/052395
§ 371 (c)(1),
(2) Date: Apr. 18, 2014

(87) PCT Pub. No.: WO2013/057448
PCT Pub. Date: Apr. 25, 2013

(65) Prior Publication Data
US 2014/0242389 A1    Aug. 28, 2014

(30) Foreign Application Priority Data
Oct. 19, 2011  (FR) ..................... 11 03185

(51) Int. Cl.
*C23C 18/16* (2006.01)
*H01L 21/02* (2006.01)
(Continued)

(52) U.S. Cl.
CPC .......... *C23C 18/1633* (2013.01); *B82Y 40/00* (2013.01); *C01B 19/008* (2013.01);
(Continued)

(58) Field of Classification Search
None
See application file for complete search history.

(56) References Cited

U.S. PATENT DOCUMENTS

| 6,207,229 B1 | 3/2001 | Bawendi et al. |
| 2007/0163638 A1* | 7/2007 | Van Duren ........... B22F 1/0055 136/262 |

(Continued)

FOREIGN PATENT DOCUMENTS

WO    2011146299 A2    11/2011

OTHER PUBLICATIONS

Wang et al. (Large-Scale synthesis of SnO2 Nanosheets with High Lithium Storage Capacity), Nov. 2009.*

(Continued)

*Primary Examiner* — Ronak C Patel
(74) *Attorney, Agent, or Firm* — Young & Thompson

(57) ABSTRACT

A process of growth in the thickness of at least one facet of a colloidal inorganic sheet, by sheet is meant a structure having at least one dimension, the thickness, of nanometric size and lateral dimensions great compared to the thickness, typically more than 5 times the thickness. The process allows the deposition of at least one monolayer of atoms on at least one inorganic colloidal sheet, this monolayer being constituted of atoms of the type of those contained or not in the sheet. Homostructured and heterostructured materials resulting from such process as well as the applications of the materials are also described. By homostructured is meant a material of homogeneous composition in the thickness and by heterostructured is meant a material of heterogeneous composition in the thickness.

5 Claims, 3 Drawing Sheets

(51) Int. Cl.
B82Y 40/00 (2011.01)
C01B 19/00 (2006.01)
B82Y 30/00 (2011.01)
(52) U.S. Cl.
CPC .... H01L 21/0237 (2013.01); H01L 21/02521 (2013.01); H01L 21/02568 (2013.01); H01L 21/02601 (2013.01); H01L 21/02628 (2013.01); *B82Y 30/00* (2013.01); *C01P 2004/24* (2013.01); *C01P 2004/80* (2013.01); *Y10S 977/755* (2013.01); *Y10S 977/81* (2013.01); *Y10S 977/811* (2013.01); *Y10S 977/892* (2013.01); *Y10T 428/2991* (2015.01)

(56) References Cited

U.S. PATENT DOCUMENTS

| | | | |
|---|---|---|---|
| 2008/0070354 A1 | 3/2008 | Jain et al. | |
| 2008/0160316 A1* | 7/2008 | Samson | B82Y 25/00 428/411.1 |
| 2009/0280586 A1 | 11/2009 | Coe-Sullivan | |
| 2009/0315016 A1 | 12/2009 | Elam et al. | |
| 2010/0330421 A1* | 12/2010 | Cui | H01M 4/134 429/217 |

OTHER PUBLICATIONS

Son et al. Large-Scale Soft Colloidal Template Synthesis of 1.4 nm Thick CdSe Nanosheets, Aug. 2009.*
Irinpan et al. Spectral and nonlinear optical characteristics of nanocomposites of ZnO—CdS, May 2008.*
Venugopal et al. Surface-Enhanced Raman Scattering and Polarized Photoluminescence from Catalytically Grown CdSe Nanobelts and Sheets, Jul. 2005.*
Gao et al. Sonochemical Synthesis, Optical Properties, and Electrical Properties of Core/Shell-Type ZnO Nanorod/CdS Nanoparticle Composites, Jan. 2005.*
Ekimov et al., "Quantum size effect in three-dimensional microscopic semiconductor crystals", JETP Lett. 1981, vol. 34, No. 6, pp. 345-348.
Alivisatos, A. P., "Semiconductor clusters, nanocrystals, and quantum dots", Science, 1996, vol. 271, pp. 933-937.
Vassiliou et al., "Magnetic and optical properties of γ-Fe2O3 nanocrystals", J. Appl. Phys., 1993, vol. 73, No. 10, pp. 5109-5116.
El-Sayed, Mostafa A., "Small is different: Shape-, size-, and composition-dependent properties of some colloidal semiconductor nanocrystals", Accounts of Chemical research, 2004, vol. 37, pp. 326-333.
Ma et al., "Nanosheets of oxides and hydroxides: Ultimate 2D charge-bearing functional crystallites", Advanced materials, 2010, vol. 22, pp. 5082-5104.
Sasaki et al., "Semiconductor Nanosheet Crystallites of Quasi-TiO2 and Their Optical Properties", The Journal of Physical Chemistry B, 1997, vol. 101, pp. 10159-10161.
Hernandez et al., "High-yield production of graphene by liquid-phase exfoliation of graphite", J. N. Nature Nanotechnology, 2008, vol. 3, pp. 563-568.
Vaughn et al., "Single-crystal colloidal nanosheets of GeS and GeSe", Journal of the American Chemical Society, 2010, vol. 132, pp. 15170-15172.
Mehta et al., "Seebeck tuning in chalcogenide nanoplate assemblies by nanoscale heterostructuring", ACS Nano, 2010, vol. 4, pp. 5055-5060.
Kumar et al., "Shape control of II-VI semiconductor nanomaterials", Small, 2006, vol. 2, No. 3, pp. 316-329.
Jun et al., "Shape control of semiconductor and metal oxide nanocrystals through nonhydrolytic colloidal routes", J. Angewandte Chemie (International ed. in English), 2006, vol. 45, pp. 3414-3439.

Xu et al., "Selective synthesis of copper nanoplates and nanowires via a surfactant-assisted hydrothermal process", Materials Chemistry and Physics, 2010, vol. 120, pp. 1-5.
Li et al., "Mass Synthesis of Large, Single-Crystal Au Nanosheets Based on a Polyol Process", Advanced Functional Materials, 2006, 16, pp. 83-90.
Sigman et al., "Solventless synthesis of monodisperse Cu2S nanorods, nanodisks, and nanoplatelets", Journal of the American Chemical Society, 2003, vol. 125, pp. 16050-16057.
Deng et al., "Synthesis of two-dimensional single-crystal berzelianite nanosheets and nanoplates with near-infrared optical absorption", Journal of Materials Chemistry, 2009, vol. 19, pp. 6201-6206.
Puntes et al., "Synthesis of hcp-Co Nanodisks", Journal of the American Chemical Society, 2002, vol. 124, pp. 12874-12880.
Si et al., "Rare-Earth oxide nanopolyhedra, nanoplates, and nanodisks", Angewandte Chemie (International ed. in English), 2005, vol. 44, pp. 3256-3260.
Zhang et al., "Large-Scale Aqueous Synthesis and Growth Mechanism of Single-Crystalline Metal Nanoscrolls at Room Temperature: The Case of Nickel", Chemistry of Materials, 2010, vol. 22, pp. 4721-4727.
Sun et al., "Shape-controlled synthesis of gold and silver nanoparticles", Science, 2002, vol. 298, pp. 2176-2179.
Ah et al., "Size-Controlled Synthesis of Machinable Single Crystalline Gold Nanoplates", Chemistry of Materials, 2005, vol. 17, pp. 5558-5561.
Huang et al., "Investigation of the Growth Process of Gold Nanoplates Formed by Thermal Aqueous Solution Approach and the Synthesis of Ultra-Small Gold Nanoplates", The Journal of Physical Chemistry C, 2007, vol. 111, pp. 2533-2538.
Deng et al., "New Method to Single-Crystal Micrometer-Sized Ultra-Thin Silver Nanosheets: Synthesis and Characterization", The Journal of Physical Chemistry C, 2009, vol. 113, pp. 867-873.
Yu et al., "Single unit cell thick samaria nanowires and nanoplates", Journal of the American Chemical Society, 2006, vol. 128, pp. 1786-1787.
Xu et al., "Single-Crystal Metal Nanoplatelets: Cobalt, Nickel, Copper, and Silver", Crystal Growth & Design, 2007, vol. 7, No. 9, pp. 1904-1911.
Yu et al., "Synthesis and Characterization of Porous Magnesium Hydroxide and Oxide Nanoplates", The Journal of Physical Chemistry B, 2004, vol. 108, pp. 64-70.
Joo et al., "Low-temperature solution-phase synthesis of quantum well structured CdSe nanoribbons", Journal of the American Chemical Society, 2006, vol. 128, pp. 5632-5633.
Yu et al., "Giant Zeeman splitting in nucleation-controlled doped CdSe:Mn2+ quantum nanoribbons", Nature Materials, 2010, vol. 9, pp. 47-53.
Yu et al., "Shape and Phase Control of ZnS Nanocrystals: Template Fabrication of Wurtzite ZnS Single-Crystal Nanosheets and ZnO Flake-like Dendrites from a Lamellar Molecular Precursor ZnS-(NH2CH2CH2NH2)0.5", Advanced Materials, 2002, vol. 14, No. 4, pp. 296-300.
Li et al., "Hydrothermal synthesis of novel sandwich-like structured ZnS/octylamine hybrid nanosheets", Solid State Communications, 2004, vol. 130, pp. 619-622.
Yao et al., "Flexible wurtzite-type ZnS nanobelts with quantum-size effects: a diethylenetriamine-assisted solvothermal approach", Small, 2005, vol. 1, No. 3, pp. 320-325.
Fan et al., "Solvothermal Synthesis and Photoluminescent Properties of ZnS/Cyclohexylamine: Inorganic-Organic Hybrid Semiconductor Nanowires", The Journal of Physical Chemistry B, 2006, vol. 110, pp. 12948-12953.
Park et al., "Synthesis, optical properties, and self-assembly of ultrathin hexagonal In2S3 nanoplates", Angewandte Chemie (International ed. in English), 2006, vol. 45, pp. 4608-4612.
Han-Mei et al., "Hydrothermal Precursor approach to single-crystal PbS nanosheets at low temperature", Chinese Journal of Inorganic Chemistry, 2007, vol. 23, No. 8, pp. 1403-1408.
Huang et al., "From single to multiple atomic layers: a unique approach to the systematic tuning of structures and properties of inorganic-organic hybrid nanostructured semiconductors", Journal of the American Chemical Society, 2007, vol. 129, pp. 3157-3162.

(56) References Cited

OTHER PUBLICATIONS

Huang et al., "From 1D chain to 3D network: tuning hybrid II-VI nanostructures and their optical properties", Journal of the American Chemical Society, 2003, vol. 125, pp. 7049-7055.

Son et al., "Large-scale soft colloidal template synthesis of 1.4 nm thick CdSe nanosheets", Angewandte Chemie (International ed. in English), 2009, vol. 48, pp. 6861-6864.

Ithurria et al., "Quasi 2D colloidal CdSe platelets with thicknesses controlled at the atomic level", Journal of the American Chemical Society, 2008, vol. 130, pp. 16504-16505.

Ithurria et al., "Continuous transition from 3D to 1D confinement observed during the formation of CdSe nanoplatelets", Journal of the American Chemical Society, 2011, vol. 133, pp. 3070-3077.

Li et al., "Size/shape-controlled synthesis of colloidal CdSe quantum disks: ligand and temperature effects", Journal of the American Chemical Society, 2011, vol. 133, pp. 6578-6586.

Hines et al., "Synthesis and Characterization of Strongly Luminescing ZnS-Capped CdSe Nanocrystals", The Journal of Physical Chemistry, 1996, vol. 100, pp. 468-471.

Peng, Xiaogang, "Green chemical approaches toward high-quality semiconductor nanocrystals", Chemistry Eur. J., 2002, vol. 8, No. 2, pp. 334-339.

Trindade et al., "Synthesis of CdS and CdSe Nanocrystallites Using a Novel Single-Molecule Precursors Approach", Chemistry of Materials, 1997, vol. 9, pp. 523-530.

Mane et al., "Chemical deposition method for metal chalcogenide thin films", Materials Chemistry and Physics, 2000, vol. 65, pp. 1-31.

Nicolau et al., "Solution deposition of thin solid compound films by a successive ionic-layer adsorption and reaction process", Applications of Surface Science, 1985, vol. 22/23, pp. 1061-1074.

Cai et al., "TiO2 coated SnO2 nanosheet films for dye-sensitized solar cells", Thin Solid Films, 2011, vol. 519, No. 16, pp. 5645-5648.

Zhang et al., "Aqueous layer-by-layer Epitaxy of Type-II CdTe/CdSe quantum dots with near-infrared fluorescence for bioimaging applications", Small, 2009, vol. 5, No. 2, pp. 185-189.

Li et al., "Preparation, conversion, and comparison of the photocatalytic property of Cd(OH)2, CdO, CdS and CdSe", Journal of Physics and Chemistry of Solids, 2009, vol. 70, No. 9, pp. 1285-1289.

Yu et al. "Electronic transport of n-type CdSe quantum dot films: Effet of film treatment", Journal of Applied Physics 2006, vol. 99, No. 10,, pp. 104315-104315-7.

International Search Report dated Mar. 4, 2013, related to the International patent application PCT/FR2012/052395, published as WO2013/057448.

French Search Report dated Jun. 28, 2012, related to the French patent application published as FR2981791.

\* cited by examiner

PROCESS FOR THE THICKNESS GROWTH OF COLLOIDAL NANOSHEETS AND MATERIALS COMPOSED OF SAID NANOSHEETS

FIELD OF INVENTION

The present invention relates to a process for growing in the thickness at least one face of an inorganic colloidal nanosheet. The invention also relates to the homostructured or heterostructured materials resulting of said process as well as the applications of said materials. By nanosheet is meant a structure having at least one dimension, the thickness, of nanometric size and lateral dimensions that are great compared to the thickness, typically more than 5 times the thickness. By homostructured is meant a material of homogeneous composition in the thickness and by heterostructured is meant a material of heterogeneous composition in the thickness.

The present invention relates in particular to a process allowing the deposition of at least one monolayer of atoms on at least one inorganic colloidal nanosheet, said monolayer being constituted of atoms that are identical or not to the atoms contained in said nanosheet.

STATE OF THE ART

The fabrication of structures having at least one nanometric dimension induces the appearance of new physical properties. These structures have characteristics that may significantly differ from those of the bulk material of the same chemical composition.

These small dimensions (at the nanometric scale) indeed lead to a modification of the electronic[1], optic[2], magnetic[3] or plasmonic[4] properties.

These new materials thus generate a growing interest in fields as diverse as optics, imaging, electronics or catalysis.

The various existing nanostructures can be classified depending on the number of nanometric-size dimensions they present. Thus, an isotropic nanocrystal is a nanometric structure in the three dimensions, while a nanowire is a nanometric structure in two dimensions.

The present invention relates to nanometric structures in one dimension, i.e. nanosheets, which we shall subsequently call either sheets or nanosheets. It relates more particularly to colloidal nanosheets, i.e. the nanosheets that can be dispersed in solution. The present invention relates to the further growth of nanosheets, i.e. the growth in the thickness of an initial nanosheet.

The synthesis of colloidal inorganic nanosheets has experienced strong growth since the early 2000s. It is possible to distinguish several types of syntheses, each associated with a set of different materials. The main existing approaches, which will be detailed in the following, are direct exfoliation of a lamellar material, chemical synthesis of monosheets of lamellar materials, growth of nanosheets by poisoning (which blocks the growth) some crystalline facets with ligands, and finally a passage by an intermediate compound of lamellar structure undergoing a topotactic transformation.

Direct exfoliation is commonly used to produce nanosheets of graphene, hydroxides or oxides[5] (e.g. $TiO_2$). The method of preparation generally consists in reducing the interaction energy between the nanosheets in order to mechanically separate them thereafter. In the case of ionic compounds one induces a swelling of the inter-sheets space (generally containing positive ions) by exchanging the cations with a highly hindered ion such as tetrabutylammonium hydroxide[6]. This swelling weakens the interaction between the nanosheets which can then be separated mechanically by sonication for example. In the case of graphite, the reduction of the inter-sheets interaction energy may be achieved by the use of a suitable solvent such as N-methylpyrrolidone[7]. This type of process always results in the production of monosheets a few Angstroms thick. No further growth is possible. The size of the nanosheets depends on the size of the exfoliated bulk object. A control of the thickness of the nanosheet is not feasible, said thickness being fixed by the lamellar structure of the starting compound and therefore by its chemical nature.

There are also many direct syntheses of mono-sheets. It is for example possible to grow graphene directly on a copper substrate. It is also possible by synthetic methods in solution to directly prepare monosheets of GeS or GeSe[8] or even multiple sheets of $Bi_2Te_3$[9]. These syntheses, however, do not allow a control of the thickness of the nanosheets or their growth in the thickness.

A much more versatile approach allowing the fabrication of nanosheets in a wide variety of different materials is the poisoning of some crystalline facets by suitable surface ligands. The preferential adsorption of molecules on some crystalline facets of the material of interest blocks the growth in the perpendicular direction to these facets and thus induces a highly anisotropic crystalline growth[10,11]. It should be noted that the poisoning molecule can be of very varied nature: surfactants[12], polymers[13], thiols[14], amines[15,16,17], inorganic ions[18]. Materials so synthesized can be for example:

nanosheets of metals (PVP[13,19,20], CTAB[21], ions[18,22])

nanosheets of rare earths oxides[17,23] (oleic acid and/or oleylamine)

nanosheets of sulfides ($Cu_2S$ in the presence of thiols[14])

This manufacturing method, although very general, still has some limitations and in particular does not allow further growth in the thickness of an initial nanosheet.

Another approach consists in synthesizing nanosheets taking advantage of the formation of an intermediate that is also lamellar. This approach can be used to produce nanosheets of metal (Cobalt, Nickel or Copper[24]) or oxides (magnesium oxide MgO[25]) through a lamellar hydroxide. Similarly, many lamellar chalcogenides are obtained by prior formation of a metal-(primary amine) complex of lamellar structure which further reacts with a sulfur or selenium precursor. It is thus possible to form nanosheets of CdSe[26] of CdMnSe[27], of ZnS[28-31], or of $In_2S_3$[32]. It should be noted that a lamellar lead-thiourea complex also allows the formation of nanosheets of PbS[33]. This alternative approach has allowed for the first time to obtain chalcogenides nanosheets whose thickness is defined at the atomic monolayer. Thus, since 2001, synthesis protocols for making hybrid organic/inorganic lamellar semiconductor materials have appeared[34]. The elemental nanosheet of these materials is constituted by a semiconducting monolayer or bilayer (ZnS[35] for example), in wurtzite structure, of [1, 1, 0] zone axis, whose surface is stabilized by a primary amine. This very general synthesis protocol can be applied to a variety of materials: CdSe, CdS, ZnS, ZnSe, ZnTe . . . . This approach was partially amended in 2006 in order to obtain individual CdSe nanosheets simply by varying the length of the alkyl chain of the primary amine[26,36]. Control of the thickness of such nanosheets remains limited and their thickness does not exceed 5 monolayers. Consequently, the optical properties of these nanosheets are very limited: fluorescence circumscribed in the blue and ultraviolet regions of the visible spectrum, full width at half maximum of the fluorescence peak greater than 12 nm. In addition, further growth in the thickness remains impossible on these nanosheets.

More recently, in 2008, a new approach that significantly improves the control of the thickness of the synthesized semiconductor nanosheets was developed[37-39]. In this case, the nanosheets comprise a semiconductor nanosheet (CdSe, CdS or CdTe) of zinc-blende structure, of [0, 0, 1] zone axis having a cationic layer stabilized by carboxylates on each side of the nanosheet. This type of synthesis allows controlling precisely the thickness of the semiconductor nanosheet, which can be between 4 and 11 monolayers depending on the synthesis protocol used. Such colloidal semiconductor nanosheets have innovative electronic and optical properties, in particular because of their perfectly controlled thickness. Thus, the fluorescence of these objects is characterized by a very narrow emission spectrum (less than 10 nm full width at half maximum) and the accessible wavelengths in fluorescence cover the entire visible spectrum. However, this new approach does not allow further growth in the thickness of an initial nanosheet.

Thus, current methods allow synthesizing nanosheets whose thickness is not always well controlled.

Currently there are also two types of methods of growth in solution of films of semiconductors on an initial material: processes of growth on colloidal nanocrystals and processes of growth on substrate.

In the case of growth processes on colloidal nanocrystals such as "quantum dots" (semiconductor nanocrystals), known growth processes involve an excess of ligands and high temperatures (over 200° C.)[40-42]. Under such conditions, it is very difficult to ensure the stability of the nanosheets. Indeed, because of their 2D structure, the nanosheets degrade and dissolve when these growth processes are used.

In the case of growth processes on a substrate, the known methods are carried out in aqueous solution and at ambient temperature. We distinguish the CBD: "Chemical Bath Deposition" growth in chemical bath[43] and the SILAR: "Successive Ion Layer Adsorption and Reaction" growth by adsorption and subsequent reaction of ionic layers[44]. These processes, in order to be applied to nanosheets, require a set of conditions that are difficult to meet, for example prior modification of the surface ligands of the nanosheets, a precise control of the pH or the absence of chelating agents (chelating agents that could lead to a dissolution of the nanosheets). The stability in solution of the inorganic semiconductor nanosheets is due to the presence of organic ligands and their interaction with the crystalline material. Changing these interactions by heating or removal of ligands causes aggregation or destruction of the nanosheets by dissolution or change in shape to a more stable thermodynamic structure.

Thus, growth in the thickness of these objects seemed difficult to achieve with known techniques described above.

None of the methods described above allows producing an inorganic particle comprising an initial nanosheet. However, this final material has numerous advantages: it is possible to cover all or part of the initial nanosheet by one or more layers of the same or different material from the material constituting the initial nanosheet, which allows obtaining a final material with very interesting properties, in terms of stability or optical properties.

The object of the present invention is therefore to provide a novel method for the further growth in the thickness of an initial nanosheet through deposition of at least one monolayer of inorganic material on said initial nanosheet.

The present invention therefore allows obtaining inorganic particles comprising an inorganic nanosheet partially or completely covered with at least one monolayer of inorganic material.

SUMMARY

An object of the present invention is an inorganic colloidal particle comprising an initial inorganic nanosheet partially or completely covered with at least one monolayer of inorganic material.

In one embodiment, said particle has a thickness of 0.5 nm to 10 mm.

In one embodiment, the lateral dimensions of said particle are at least 1.5 times its thickness.

In one embodiment, the material of the initial nanosheet of said particle comprises a material $M_xE_y$, wherein
  M is Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, or a mixture thereof,
  E is O, S, Se, Te, N, P, As, F, Cl, Br, I, or a mixture thereof,
  and x and y are independently a decimal number from 0 to 5, and not simultaneously equal to 0.

In one embodiment, the initial nanosheet is totally or partially covered with one monolayer of material M or E, wherein
  M is Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, or a mixture thereof, and
  E is O, S, Se, Te, N, P, As, F, Cl, Br, I, or a mixture thereof.

In one embodiment, the initial nanosheet is totally or partially covered with at least two monolayers, where the monolayers are alternatively composed of M then E or conversely,
  wherein M is Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, or a mixture thereof, and
  E is O, S, Se, Te, N, P, As, F, Cl, Br, I, or a mixture thereof.

Another object of the invention is a process of growth in the thickness of a inorganic colloidal nanosheet by deposition of at least an element R on at least one face of at least one inorganic colloidal nanosheet, the process comprising the following steps:

(1) putting in contact at least one inorganic nanosheet with a precursor of the element R to deposit, this precursor being at a positive degree of oxidation if the nanosheet has a negative surface charge and at a negative degree of oxidation if the nanosheet has a positive surface charge.

(2) waiting for a time t that the precursor of R has reacted with the atoms at the surface of one or several nanosheets.

In one embodiment, the precursor of the element R is a precursor of M or E depending on the composition of the initial nanosheet.

In one embodiment, we implement the two previous steps (1) and (2) n time where n is an integer greater or equal to 1.

In one embodiment, we change successively the element R at each implementation of the process according to the composition of the previous monolayer.

In one embodiment, we deposit at the surface of at least one initial nanosheet a cationic monolayer (M) then an anionic monolayer (E) or conversely, thereby forming a bilayer consisting of MxEy composed by the elements M and E.

In one embodiment, at least one initial nanosheet can be fixed on a substrate.

Another object of the invention is the use of said aforementioned nanoparticles or nanoparticles obtained by the process described above, as fluorescent agents, catalysis agents, absorbing and/or collecting elements of a photovoltaic cell or field effect transistor.

Another object of the invention is a luminescent or electroluminescent system or an amplifying stage of a laser comprising at least one aforementioned particle or a particle obtained by the process described above.

Another object of the invention is a catalyst comprising at least one aforementioned particle or a particle obtained by the process described above.

Another object of the invention is a photovoltaic cell comprising at least one aforementioned particle or a particle obtained by the process described above.

Another object of the invention is a transistor comprising at least one aforementioned particle or a particle obtained by the process described above.

DETAILED DESCRIPTION

For the purposes of the present invention, the terms sheets and nanosheets are equivalent. A nanosheet presents a quasi-2D crystalline structure whose at least one dimension, preferably the thickness, is less than 1 µm. The lateral dimensions, i.e. the width and the length, of the nanosheet are great compared to the thickness, i.e. at least 1.5 times greater. The nanosheet is anisotropic.

The increase in the initial nanosheet thickness allows significantly extending the spectral characteristics of said sheet such as emission or absorption spectra. It therefore seems desirable to develop a method of growth in the thickness to reach greater thicknesses. Furthermore, it would be desirable for many applications to be able to deposit on the initial nanosheet a material different from the one composing the nanosheet.

Thus, the final particles increased in their thickness according to the invention present new or improved properties compared to initial nanosheets, such as high quantum yield, increased stability, better surface stability, low fluorescence full width at half maximum (less than 30 nm, preferably less than 25 nm), a fast fluorescence lifetime (less than 40 ns, preferably less than 10 ns) a high absorption cross section (approximately or more than $10^{-13}$ cm$^2$ at 400 nm), possible tuning of the emission wavelength, robustness through time of the optical properties, a high specific surface.

The present invention therefore relates to a final particle or object comprising an initial nanosheet where at least a part of the particle has a thickness greater than the thickness of the initial nanosheet.

The present invention therefore relates to a final particle or object comprising an initial nanosheet partially or completely covered with at least one layer of additional material.

The present invention therefore relates to a final particle or object comprising an initial nanosheet partially or completely covered on a least one facet by at least one layer of additional material.

For the purpose of the present invention, the term "layer" refers to a film or a continuous or partial layer being at least one atom thick. The term "monolayer" refers to a film or a continuous or partial layer being one atom thick. The atoms composing the layer or the monolayer can be identical or different.

In one embodiment, at least one part of the final particle or object has a thickness greater than the thickness of the initial nanosheet.

In one embodiment, the final particle or object comprises the initial nanosheet totally covered with at least one layer of material.

In one embodiment, the final particle or object comprises the initial nanosheet totally covered with a first monolayer of material, said first monolayer being partially or completely covered with at least a second monolayer of material.

In one embodiment, the initial nanosheet has a thickness of 0.3 nm to less than 500 nm, of 5 nm to less than 250 nm, of 0.3 nm to less than 100 nm, of 0.3 nm to less than 50 nm, of 0.3 nm to less than 25 nm, of 0.3 nm to less than 20 nm, of 0.3 nm to less than 15 nm, of 0.3 nm to less than 10 nm, of 0.3 nm to less than 5 nm.

In one embodiment, at least one of the lateral dimensions (length or width) of the initial nanosheet is at least 1.5 times the thickness of the initial nanosheet, at least 2 times the thickness of the initial nanosheet, at least 2.5 times the thickness of the initial nanosheet, at least 3 times the thickness of the initial nanosheet, at least 3.5 times the thickness of the initial nanosheet, at least 4 times the thickness of the initial nanosheet, at least 4.5 times the thickness of the initial nanosheet, at least 5 times the thickness of the initial nanosheet.

In one embodiment, the lateral dimensions of the initial nanosheet are at least 0.45 nm to at least 2500 nm.

In one embodiment, at least one of the lateral dimensions of the initial nanosheet is from 2 nm to 1 m, from 2 nm to 100 mm, from 2 nm to 10 mm, from 2 nm to 1 mm, from 2 nm to 100 µm, from 2 nm to 10 µm, from 2 nm to 1 µm, from 2 nm to 100 nm, from 2 nm to 10 nm.

In one embodiment, the material composing the initial nanosheet comprises a material MxEy, wherein M is Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, or a mixture thereof, E is O, S, Se, Te, N, P, As, F, Cl, Br, I, or a mixture thereof, and x and y are independently a decimal number from 0 to 5, and not simultaneously equal to 0.

In one embodiment, the semiconducting material composing the initial nanosheet comprises a compound of group II-VI, of group II-V, of group III-VI, of group III-V, of group IV-VI, of group I-III-VI, of group II-IV-VI or of group II-IV-V or a mixture thereof.

In one embodiment, the material composing the initial nanosheet comprises at least one semiconductor chosen among CdS, CdSe, CdTe, ZnS, ZnSe, ZnTe, HgS, HgSe, HgTe, HgO, GeS, GeSe, GeTe, SnS, SnSe, SnTe, PbS, PbSe, PbTe, GeS$_2$, GeSe$_2$, SnS$_2$, SnSe$_2$, CuInS$_2$, CuInSe$_2$, AgInS$_2$, AgInSe$_2$, CuS, Cu$_2$S, Ag$_2$S, Ag$_2$Se, Ag$_2$Te FeS, FeS$_2$ InP, Cd$_3$P$_2$, Zn$_3$P$_2$, CdO, ZnO, FeO, Fe$_2$O$_3$, Fe$_3$O$_4$, Al$_2$O$_3$, TiO$_2$, MgO, MgS, MgSe, MgTe, AlN, AlP, AlAs, AlSb, GaN, GaP, GaAs, GaSb, InN, InP, InAs, InSb, TlN, TlP, TlAs, TlSb, or a mixture thereof.

In one embodiment, the material composing the initial nanosheet comprises at least one metal chosen among Cu, Ag, Au, Ni, Pd, Pt, Co, Fe, Ru, Os, Mn, Tc, Re, Cr, Mo, W, V, Nd, Ta, Ti, Zr, Hf, or a mixture thereof.

In one embodiment, the material composing the initial nanosheet comprises at least one semiconductor chosen preferably among CdS, CdSe, CdTe, ZnS, ZnSe, ZnTe, PbS, PbSe, PbTe, CuInS$_2$, CuInSe$_2$, AgInS$_2$, AgInSe$_2$, CuS, Cu$_2$S, Ag$_2$S, Ag$_2$Se, Ag$_2$Te, FeS, FeS$_2$, PdS, Pd$_4$S, WS$_2$.

In one embodiment, the final particle or object has a thickness of 0.5 nm to 10 mm, of 0.5 nm to 1 mm, of 0.5 nm to 100 µm, of 0.5 nm to 10 µm, of 0.5 nm to 1 µm, of 0.5 nm to 500 nm, of 0.5 nm to 250 nm, of 0.5 nm to 100 nm, of 0.5 nm to 50 nm, of 0.5 nm to 25 nm, of 0.5 nm to 20 nm, of 0.5 nm to 15 nm, of 0.5 nm to 10 nm, of 0.5 nm to 5 nm.

In one embodiment, at least one of the lateral dimensions (length or width) of the final particle or object represents at least 1.5 times the thickness of the final particle or object, at least 2 times the thickness of the final particle or object, at least 2.5 times the thickness of the final particle or object, at least 3 times the thickness of the final particle or object, at least 3.5 times the thickness of the final particle or object, at least 4 times the thickness of the final particle or object, at least 4.5 times the thickness of the final particle or object, at least 5 times the thickness of the final particle or object.

In one embodiment, the lateral dimensions of the final particle or object are at least 0.75 nm to at least 50 mm.

In one embodiment, at least one of the lateral dimensions of the final particle or object is 2 nm to 1 m, 2 nm to 100 mm, 2 nm to 10 mm, 2 nm to 1 mm, 2 nm to 100 µm, 2 nm to 10 µm, 2 nm to 1 µm, 2 nm to 100 nm, 2 nm to 10 nm.

In one embodiment, the final particle or object is homo-structured, i.e. the initial nanosheet and the at least one monolayer are composed of the same material.

In one embodiment, the final particle or object is hetero-structured, i.e. the initial nanosheet and the at least one monolayer are composed of at least two different materials.

In one embodiment where several monolayers recover all or part of the initial nanosheet, these monolayers can be composed of the same material or composed of different materials.

In one embodiment where several monolayers cover all or part of the initial nanosheet, these monolayers can be composed such as to form a gradient of materials.

In one embodiment, the final particle or object can comprise the initial nanosheet and at least one monolayer covering all or part of the initial nanosheet, said monolayer being composed of the same material as the initial nanosheet or a different material than the initial nanosheet.

In one embodiment, the final particle or object can comprise the initial nanosheet and 1, 2, 3, 4, 5 or more monolayers covering all or part of the initial nanosheet, said monolayers begin of same composition as the initial nanosheet or being of different composition than the initial nanosheet or being of different composition one another.

In one embodiment, the final particle or object can comprise the initial nanosheet and at least 2, 3, 4, 5 or more monolayers in which the first deposited monolayer covers all or part of the initial nanosheet and the at least second deposited monolayer covers all or part of the previously deposited monolayer, said monolayers being of same composition as the initial nanosheet or being of different composition than the initial nanosheet and possibly of different compositions one another.

Therefore in one embodiment, the final particle or object comprises the initial nanosheet completely covered with at least one continuous monolayer then completely or partially covered with at least another monolayer, said monolayers being of same composition as the initial nanosheet or being of different composition than the initial nanosheet and possibly being of different compositions one another.

In one embodiment, the final particle or object has a core/shell structure, i.e. an initial nanosheet of given composition covered on its entire surface by at least one monolayer of different composition than the initial nanosheet.

Therefore, the obtained material is composed of a pilling of films where at least one is of identical or different chemical composition than the initial nanosheet, the surface of each film completely covering the surface of the film on which it is deposited.

In one embodiment, the final particle or object has a dewetted structure, i.e. an initial nanosheet of given composition partially covered with at least one monolayer of the same or different composition than the initial nanosheet.

Therefore, the obtained material is composed of a pilling of films where at least one is of the same or different chemical composition than the initial nanosheet, the surface of each film partially covering the surface of the films on which it is deposited.

In one embodiment, the material composing the at least one monolayer comprises a material M or E wherein M is Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, or a mixture thereof, E is O, S, Se, Te, N, P, As, F, Cl, Br, I, or a mixture thereof, In one embodiment, the material composing the at least one monolayer comprises at least one metal chosen among Cu, Ag, Au, Ni, Pd, Pt, Co, Fe, Ru, Os, Mn, Tc, Re, Cr, Mo, W, V, Nd, Ta, Ti, Zr, Hf, or a mixture thereof.

In one embodiment where the final particle or object comprises at least one layer, i.e. at least 2 monolayers (2 monolayers being also defined as a bilayer), said layer comprises a compound of group II-VI, of group II-V, of group III-VI, of group III-V, of group IV-VI, of group I-III-VI, of group II-IV-VI or of group II-IV-V or a mixture thereof.

In one embodiment where the final particle or object comprises at least one layer, i.e. at least 2 monolayers (2 monolayers being also defined as a bilayer), said layer comprises at least one semiconductor chosen among CdS, CdSe, CdTe, ZnS, ZnSe, ZnTe, HgS, HgSe, HgTe, HgO, GeS, GeSe, GeTe, SnS, SnSe, SnTe, PbS, PbSe, PbTe, GeS$_2$, GeSe$_2$, SnS$_2$, SnSe$_2$, CuInS$_2$, CuInSe$_2$, AgInS$_2$, AgInSe$_2$, CuS, Cu$_2$S, Ag$_2$S, Ag$_2$Se, Ag$_2$Te FeS, FeS$_2$ InP, Cd$_3$P$_2$, Zn$_3$P$_2$, CdO, ZnO, FeO, Fe$_2$O$_3$, Fe$_3$O$_4$, Al$_2$O$_3$, TiO$_2$, MgO, MgS, MgSe, MgTe, AlN, AlP, AlAs, AlSb, GaN, GaP, GaAs, GaSb, InN, InP, InAs, InSb, TlN, TlP, TlAs, TlSb, or a mixture thereof.

In one embodiment, the material composing the at least one layer comprises at least one semiconductor chosen preferably among CdS, CdSe, CdTe, ZnS, ZnSe, ZnTe, PbS, PbSe, PbTe, CuInS$_2$, CuInSe$_2$, AgInS$_2$, AgInSe$_2$, CuS, Cu$_2$S, Ag$_2$S, Ag$_2$Se, Ag$_2$Te, FeS, FeS$_2$, PdS, Pd$_4$S, WS$_2$.

In one embodiment, the initial nanosheet is an inorganic colloidal nanosheet.

In one embodiment, the initial nanosheet is crystalline.

In one embodiment, the final particle or object is a nanosheet.

In one embodiment, the final particle or object is inorganic.

In one embodiment, the final particle or object is colloidal.

In one embodiment, the final particle or object is crystalline.

In one embodiment, the initial nanosheet comprised in the final particle or object has preserved its quasi-2D structure.

In one embodiment, the material covering the initial nanosheet is inorganic.

The present invention relates to a process of growth in the thickness by deposition of at least an element R on at least one face of at least one inorganic colloidal nanosheet, the process comprising the following steps:

putting in contact at least one inorganic nanosheet with a precursor of the element R to be deposited, this precursor being at a positive degree of oxidation if the nanosheet has a negative surface charge and at a negative degree of oxidation if the nanosheet has a positive surface charge.

waiting for a time t that the precursor of R has reacted with the atoms at the surface of one or several nanosheets.

Optionally, we remove after the reaction the excess of precursor.

In one embodiment, the material composing the initial nanosheet comprises a material MxEy, wherein M is Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, or a mixture thereof, E is O, S, Se, Te, N, P, As, F, Cl, Br, I, or a mixture thereof, and x and y are independently a decimal number from 0 to 5, and not simultaneously equal to 0.

In one embodiment, the semiconducting material composing the initial nanosheet comprises a compound of group II-VI, of group II-V, of group III-VI, of group III-V, of group IV-VI, of group I-III-VI, of group II-IV-VI or of group II-IV-V or a mixture thereof.

In one embodiment, the material composing the initial nanosheet comprises at least one semiconductor chosen among CdS, CdSe, CdTe, ZnS, ZnSe, ZnTe, HgS, HgSe, HgTe, HgO, GeS, GeSe, GeTe, SnS, SnSe, SnTe, PbS, PbSe, PbTe, $GeS_2$, $GeSe_2$, $SnS_2$, $SnSe_2$, $CuInS_2$, $CuInSe_2$, $AgInS_2$, $AgInSe_2$, CuS, $Cu_2S$, $Ag_2S$, $Ag_2Se$, $Ag_2Te$ FeS, $FeS_2$ InP, $Cd_3P_2$, $Zn_3P_2$, CdO, ZnO, FeO, $Fe_2O_3$, $Fe_3O_4$, $Al_2O_3$, $TiO_2$, MgO, MgS, MgSe, MgTe, AlN, AlP, AlAs, AlSb, GaN, GaP, GaAs, GaSb, InN, InP, InAs, InSb, TlN, TlP, TlAs, TlSb, or a mixture thereof.

In one embodiment, the material composing the initial nanosheet comprises at least one metal chosen among Cu, Ag, Au, Ni, Pd, Pt, Co, Fe, Ru, Os, Mn, Tc, Re, Cr, Mo, W, V, Nd, Ta, Ti, Zr, Hf, or a mixture thereof.

In one embodiment, the material composing the initial nanosheet comprises at least one semiconductor chosen preferably among CdS, CdSe, CdTe, ZnS, ZnSe, ZnTe, PbS, PbSe, PbTe, $CuInS_2$, $CuInSe_2$, $AgInS_2$, $AgInSe_2$, CuS, $Cu_2S$, $Ag_2S$, $Ag_2Se$, $Ag_2Te$, FeS, $FeS_2$, PdS, $Pd_4S$, $WS_2$.

In one embodiment, the precursor of the element R to be deposited is introduced in an amount at least sufficient to be in stoichiometric proportions with the surface atoms of one or several nanosheets.

In one embodiment, the precursor of the element R to be deposited is introduced in sub-stoichiometric amount (to partially cover the initial nanosheet or the previous layer).

In one embodiment, we implement the two, or optionally the three, steps of the above process n time where n is an integer greater or equal to 1.

In one embodiment, the element R successively implemented above may be of a different composition.

In one embodiment where we implement one time (n=1) the two, or optionally the three, steps of the process as described above, the element R is either M or E and the precursor of the element R is respectively either a precursor of M or a precursor of E, depending on the composition of the initial nanosheet, wherein M is Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, or a mixture thereof, E is O, S, Se, Te, N, P, As, F, Cl, Br, I, or a mixture thereof.

In one embodiment where we implement several times (n>1) the two, or optionally the three, steps of the process as described above, the element R deposited first is either M or E, the element R deposited in second is E if the first element R deposited is M or M if the first element R deposited is E, and so on.

In one embodiment where we implement several times (n>1) the two, or optionally the three, steps of the process as described above, we alternate systematically the deposition of a monolayer of M and a monolayer of E or conversely.

Therefore, in one embodiment where we implement two times (n=2) the two, or optionally the three, steps of the process as described above, a bilayer $M_1E_1$ or $E_1M_1$ is formed on the initial nanosheet.

In one embodiment where we implement three times (n=3) the two, or optionally the three, steps of the process as described above, a bilayer $M_1E_1$ or $E_1M_1$ is formed on the initial nanosheet then a monolayer $E_2$ or $M_2$, said $E_2$ or $M_2$ being identical or different in composition than $E_1$ or $M_1$.

In one embodiment where we implement four times (n=4) the two, or optionally the three, steps of the process as described above, a bilayer $M_1E_1$ or $E_1M_1$ is formed on the initial nanosheet then a bilayer $M_2E_2$ or $E_2M_2$ respectively, said $E_2$ or $M_2$ being identical or different in composition than $E_1$ or $M_1$.

Therefore, in one embodiment we implement n time the two, or optionally the three, steps of the process as described above, when n is odd:
the initial nanosheet is covered with (n−1)/2 bilayer(s) all ME or all EM then a monolayer M or E respectively, the element M and E can be in the same or different composition.

when n is even:
the initial nanosheet is recovered by n/2 bilayer(s) ME or EM, the element M and E can be in the same or different composition.

In one embodiment, the bilayers ME or EM formed correspond to a compound of group II-VI, of group II-V, of group III-VI, of group III-V, of group IV-VI, of group I-III-VI, of group II-IV-VI or of group II-IV-V or a mixture thereof.

In one embodiment, the bilayers ME or EM formed correspond to at least one semiconductor chosen among CdS, CdSe, CdTe, ZnS, ZnSe, ZnTe, HgS, HgSe, HgTe, HgO, GeS, GeSe, GeTe, SnS, SnSe, SnTe, PbS, PbSe, PbTe, $GeS_2$, $GeSe_2$, $SnS_2$, $SnSe_2$, $CuInS_2$, $CuInSe_2$, $AgInS_2$, $AgInSe_2$, CuS, $Cu_2S$, $Ag_2S$, $Ag_2Se$, $Ag_2Te$ FeS, $FeS_2$ InP, $Cd_3P_2$, $Zn_3P_2$, CdO, ZnO, FeO, $Fe_2O_3$, $Fe_3O_4$, $Al_2O_3$, $TiO_2$, MgO, MgS, MgSe, MgTe, AlN, AlP, AlAs, AlSb, GaN, GaP, GaAs, GaSb, InN, InP, InAs, InSb, TlN, TlP, TlAs, TlSb, or a mixture thereof.

In one embodiment, the material of the at least one monolayer M comprises at least one metal selected from Cu, Ag, Au, Ni, Pd, Pt, Co, Fe, Ru, Os, Mn, Tc, Re, Cr, Mo, W, V, Nd, Ta, Ti, Zr, Hf, or a mixture thereof.

In one embodiment, the material of the at least one monolayer E comprises at least one material selected from O, S, Se, Te, N, P, As, F, Cl, Br, I, or a mixture thereof.

In one embodiment, the bilayers ME or EM formed correspond to at least one semiconductor preferably selected from CdS, CdSe, CdTe, ZnS, ZnSe, ZnTe, PbS, PbSe, PbTe, $CuInS_2$, $CuInSe_2$, $AgInS_2$, $AgInSe_2$, CuS, $Cu_2S$, $Ag_2S$, $Ag_2Se$, $Ag_2Te$, FeS, $FeS_2$, PdS, $Pd_4S$, $WS_2$.

In one embodiment, we deposit on the surface of at least one inorganic colloidal nanosheet a cationic monolayer (M) then a anionic monolayer (E) or conversely, thereby forming a bilayer consisting of MxEy composed by the element M and E in stoichiometric ratio, the stoichiometric ratio being characterized by the x and y values corresponding to the absolute value of the oxidation states of elements E and M respectively.

In one embodiment, the above deposition sequence is repeated m time where m is an integer at least equal to 1 which forms a film of composition MxEy.

In one embodiment, the reaction time of the precursor R is less than few hours, preferably less than 24 hours, or less than 12 hours, or less than 6 hours, or less than 4 hours, or less than 2 hours, or less than 1 hour.

In one embodiment, the reaction time t of the precursor R is between one millisecond and one minute.

In one embodiment, the film deposited is an alloy of the aforementioned materials.

In one embodiment, the film deposited of composition MxEy is a chalcogenide.

In one embodiment, the film deposited of composition MxEy is a phosphide.

In one embodiment, the film deposited of composition MxEy is an oxide.

In one embodiment, the film deposited comprises a transition metal or a lanthanide in minor quantities (doping).

In one embodiment, the film deposited comprises in minor quantities an element inducing an excess or a defect of electrons compared to the sole film (electronic doping).

In one embodiment, one or several initial nanosheets can be fixed on at least one substrate.

In one embodiment, the fixation of one or several initial nanosheets on the at least one substrate is done by adsorption or by chemical coupling.

In one embodiment, said substrate is chosen among silica $SiO_2$, aluminum oxide $Al_2O_3$, indium-tin oxide ITO, fluorine-doped tin oxide FTO, titanium oxide $TiO_2$, gold, silver, nickel, molybdenum, aluminum, silicium, germanium, silicon carbide SiC, graphene and cellulose.

In one embodiment, said substrate comprises a polymer.

In one embodiment, the initial nanosheet is dispersed in a dispersing solvent.

In one embodiment, the dispersion medium is an organic medium, preferably apolar or weakly polar.

In one embodiment, the dispersing solvent of the nanosheets is chosen among distilled water, methanol, ethanol, isopropanol, butanol, chloroform, acetone, hexane, tetrahydrofuran, dimethylsulfoxide, toluene, octadecene and dimethylformamide.

In one embodiment, the dispersing solvent of the nanosheets is a supercritical fluid.

In one embodiment, the dispersing solvent of the nanosheets is an ionic liquid.

In one embodiment, a stabilizing compound capable of stabilizing the final particle(s)s or object(s) can be introduced in the dispersing solvent.

In one embodiment, the stabilizing compound of the final particles or objects comprises an organic ligand.

In one embodiment, the organic ligand comprises a carboxylic acid, a thiol, an amine, a phosphine, an amide, an ester, a pyridine, an imidazole, an alcohol.

In one embodiment, the stabilizing compound of the final particles or objects is an ion.

In one embodiment, the stabilizing ion comprises a quaternary ammonium.

In one embodiment, the temperature of the reaction medium is set between 100° C. and 350° C.

In one embodiment, the temperature of the reaction medium is −80° C. to 150° C., 20° C. to 100° C., 40° C. to 80° C., approximately 60° C. (60° C.±5° C.).

In one embodiment, the temperature of the reaction medium is ambient temperature.

In one embodiment, an annealing process is performed in order to decrease the surface's roughness of the final particle or object.

In one embodiment, the excess of precursors is discarded after reaction

In one embodiment, the nanosheets obtained after the reaction of the precursor R thereon are purified.

In one embodiment, the purification is done by flocculation and/or precipitation.

In one embodiment, the purification is done by filtration.

In one embodiment, if R is a chalcogenide, the precursor of R is a compound containing the chalcogenide at the −2 oxidation state.

In one embodiment, if R is sulfur, the precursor of R is a salt containing $S^{2-}$ sulfide ions.

In one embodiment, the precursor of R comprises bis(trimethylsilyl) sulfide ($TMS_2S$) or hydrogen sulfide ($H_2S$) or sodium hydrogen sulfide (NaSH) or sodium sulfide ($Na_2S$) or ammonium sulfide ($S(NH_4)_2$) or thioruea or thioacetamide.

In one embodiment, if R is selenium, the precursor of R comprises a salt containing $Se^{2-}$ selenide ions.

In one embodiment, the precursor of R comprises bis(trimethylsilyl) selenide ($TMS_2Se$) or hydrogen selenide ($H_2Se$) or sodium selenide ($Na_2Se$) or sodium hydrogen selenide (NaSeH) or sodium selenosulfate ($Na_2SeSO_3$) or selenourea.

In one embodiment, if R comprises tellurium, the precursor of R is a salt containing $Te^{2-}$ telluride ions.

In one embodiment, the precursor of R is bis(trimethylsilyl) telluride ($TMS_2Te$) or hydrogen telluride ($H_2Te$) or sodium telluride ($Na_2Te$) or sodium hydrogen telluride (NaTeH) or sodium tellurosulfate ($Na_2TeSO_3$).

In one embodiment, if R is a chalcogenide, the precursor of R is formed in situ by reaction of a reducing agent with a compound containing R at the 0 oxidation state or at a strictly positive oxidation state.

In one embodiment, if R is a metal, the precursor of R is a compound containing the metal at positive or 0 oxidation state.

In one embodiment, if R is a metal, the precursor of R comprises a metallic salt.

In one embodiment, the metallic salt is a carboxylate of R, or a chloride of R, or a nitrate of R, or a sulfate of R, or a thiolate of R.

In one embodiment, if R is oxygen, the precursor of R is the hydroxide ion ($HO^-$).

In one embodiment, if R is oxygen the precursor of R is a solution of sodium hydroxide (NaOH) or of potassium hydroxide (KOH) or of tetramethylammonium hydroxide (TMAOH).

In one embodiment, if E is phosphorus, the precursor of E comprises phosphorus at the −3 oxidation state.

In one embodiment, the precursor of E comprises tris (trimethylsilyl) phosphine ($TMS_3P$) or phosphine ($PH_3$) or white phosphorus ($P_4$) or phosphorus trichloride ($PCl_3$).

In one embodiment, a reducing agent can be introduced at the same time as the precursor(s) of the film to be deposited.

In one embodiment, the reducing agent comprises a hydride.

In one embodiment, the reducing agent comprises dihydrogen.

In one embodiment, the hydride comprises sodium tetrahydroborate ($NaBH_4$); sodium hydride (NaH), lithium tetrahydroaluminate ($LiAlH_4$), diisobutylaluminum hydride (DIBALH).

The present invention also relates to the use of the final particles or objects described above.

Indeed, these final particles or objects further grown in the thickness have numerous advantages and properties such as high quantum yield, better stability, better surface stability, narrow full width at half maximum (less than 30 nm, preferably less than 25 nm), fast fluorescence lifetime (less than 40 ns, preferably less than 10 ns), a high absorption cross-section (approximately or more than $10^{-13}$ $cm^2$ at 400 nm), a possible tuning of the emission wavelength, a robustness through time of the optical properties, a high specific surface.

These different properties make the final particles or objects such as described above useful objects for applications in fluorescence, especially in luminescent or electroluminescent systems or the amplification stage of a laser.

As an example, CdSe nanosheets covered with a CdS or a CdZnS shell as described in the examples have a high quantum yield that can be over 60% as well as a narrow fluorescence full width at half maximum (less than 20 nm). Other examples of final particles or objects useful for applications in fluorescence are CdS nanosheets covered with ZnS (CdS/ZnS), $CdSe_xS_{1-x}$ (x being a decimal number from 0 to 1) covered with $Cd_yZn_{1-y}S$ (y being a decimal number from 0 to 1) (CdSeS/CdZnS), CdTe nanosheets covered with $Cd_yZn_{1-y}Se_xS_{1-x}$ (x and y being decimal number independently from 0 to 1) (CdTe/CdZnSeS), CdS nanosheets covered with manganese(II) or copper(II)-doped ZnS CdS/ZnS:Mn or CdS/ZnS:Cu.

These final particles or objects such as described above are also useful as catalysts because of their high specific surface, their better stability, their great absorption cross-section.

CdS, ZnS and alloys thereof nanosheets and CdSe nanosheets can for example be covered with platinum and/or palladium sulfide. The obtained composite has a photocatalytic dihydrogen production activity. Other examples of final particles or objects useful in catalytic applications are CdS or CdSe nanosheets covered with $TiO_2$, CdSe or CdS nanosheets covered with a metallic layer such as Cu, Ag, Au, Ni, Pd, Pt, Co, Fe, Ru, Os, Mn, Tc, Re, Cr, Mo, W, V, Nd, Ta, Ti, Zr, Hf.

These final particles or objects such as described above are also very useful as an absorbing and/or collecting element of a photovoltaic cell because of their better stability, enhanced electron/hole mobility and high absorption cross section.

As an example, CdSe nanosheets with big dimensions (more than 100 nm of lateral extension) can be covered with a doped shell (CdZnS doped with $Ag^+$ for example). This allows increasing the electronic mobility of the absorbing and collecting elements of a solar cell containing such final object: CdSe/CdTe, CdTe/CdSe, PbSe/PbS, ZnS/InP, CuInS2/ZnS, $CdS/CuInS_2$.

These final particles or objects such as described above are also very useful as field effect transistor due to their better stability, enhanced electron/hole mobility and a high density of charge carriers.

As an example, CdSe nanosheets with big dimensions (more than 100 nm of lateral extension) can be covered with a doped shell (CdZnS doped with $Ag^+$ for example). This allows enhancing the electronic mobility in the final objects. Equally, a low band gap semiconducting sheet covered with a high band gap semiconductor shell allows obtaining a high mobility while keeping an excitonic structure. PbS nanosheets covered with a layer of CdS is an example of final particles or objects useful for field effect transistor applications.

Another aspect of the invention relates to a luminescent system, an electroluminescent system, or an amplifying stage of a laser, a high specific surface and crystallinity catalyst of controlled surface, an absorbing and/or collecting element of a photovoltaic cell or a field effect transistor comprising an element obtained according to a process described according to one embodiment of the invention.

Other characteristics and advantages of the process according to the invention will appear after reading the detailed description and the examples given after as purely illustrative means.

EXAMPLES

The present invention will be better understood on reading the following examples illustrating non-exhaustively the invention.

Figure 2:
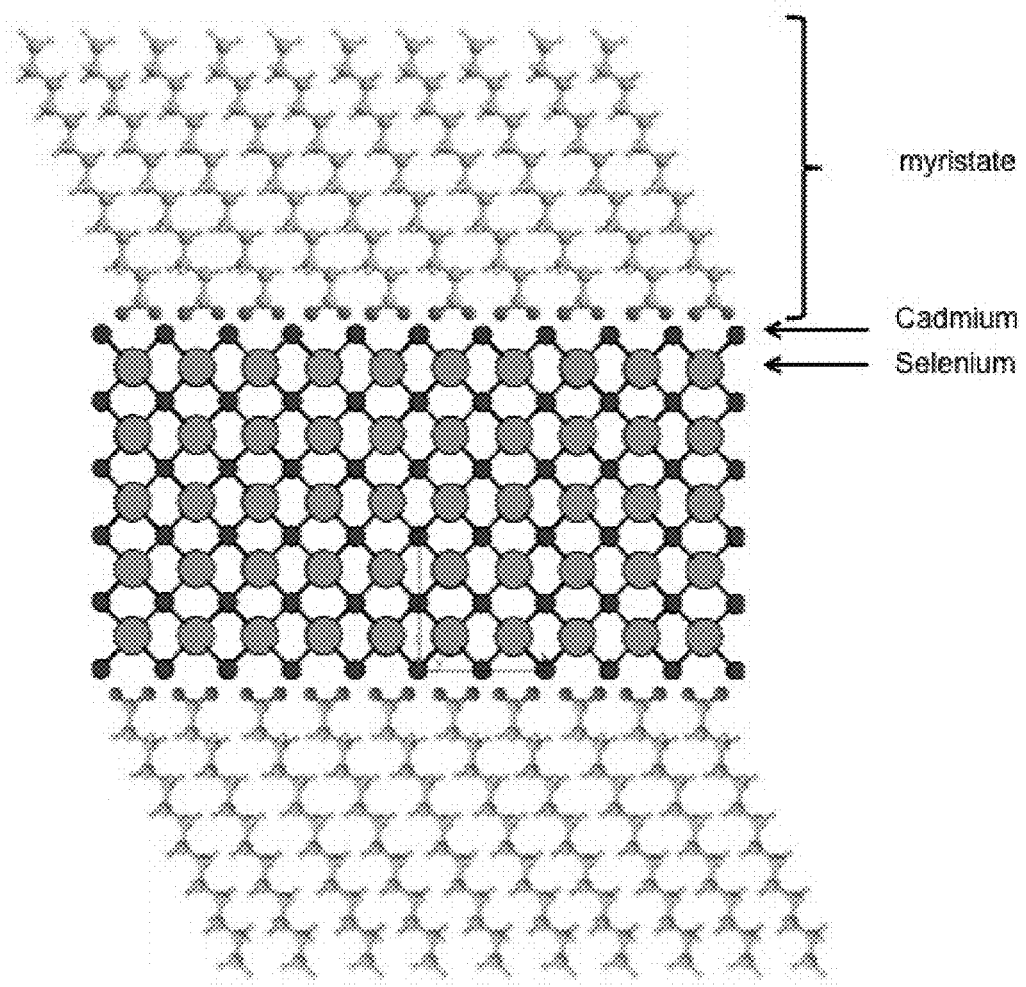
FIG. 2 shows the crystal structure of a CdSe sheet seen in sectional view according to one embodiment of the invention.

Initial Sheets:

The initial nanosheets on which a process of growth in the thickness according to at least one embodiment of the invention is particularly efficient are the nanosheets having a surface charge. This surface charge can be positive or negative depending on the nature of the initial nanosheet considered. The semiconducting nanosheets such as described above (for example CdSe, CdS or CdTe) belong to this class of materials and will be taken as non-limitative examples of initial nanosheets. Such a sheet whose structure is schematized in FIG. 2 has a zinc-blende structure, a [0, 0, 1] zone axis and has a cationic surface stabilized by carboxylates on each facet of the sheet. These facets are perfectly polar (in this case cationic).

CdSe nanosheets for example can be obtained by any method known, such as described for example in the following documents: Ithurria, S.; Dubertret, B. Journal of the American Chemical Society 2008, 130, 16504-5 and Ithurria, S.; Bousquet, G.; Dubertret, B. Journal of the American Chemical Society 2011, 133, 3070-7. 174 mg of Cd(myristate)$_2$ and 12 mg of selenium are introduced in a three-necked round-bottomed flask containing 16 ml, of 1-octadecene (ODE, 90%). The flask is degassed under reduced pressure and stirring at room temperature for 30 minutes. Argon is introduced in the flask which is then heated. When the temperature reaches 200° C., 40 mg of Cd(acetate)$_2$(H$_2$O)$_2$ are rapidly introduced in the reaction medium inducing the growth of the nanosheets. The reaction mixture is heated at 240° C., temperature at which it is held for approximately 10 minutes in order to ensure the growth of the sheets. The solution is then cooled down and washed by successive precipitation/suspension. The first precipitation is done by addition of a non-solvent: ethanol (80 mL approximately) and centrifugation (5000 rpms for 10 minutes). The supernatant is discarded and the pellet is suspended in hexane (10 mL approximately). The sheets' solution still contains a lot of Cd(myristate)$_2$ in excess. Adding a few milliliters of octylamine (4 mL) allows its dissolution. The suspension of nanoplatelets is then precipitated a second time by addition of ethanol (80 mL) and centrifugation. The suspension/precipitation process is repeated twice more with octylamine and one last time simply by suspension in hexane and precipitation with ethanol. The final precipitate is suspended in 10 mL of chloroform (CHCl$_3$). The as-obtained sheets have the structure schematized in FIG. 2 which shows the crystalline structure of a CdSe sheet seen in sectional view.

Deposition of a Film of Chalcogenides on the Sheets

The colloidal CdSe/CdS sheets, according to at least one embodiment of the invention, are prepared by a layer-by-layer deposition of CdS on initial CdSe sheets.

Figure 1:
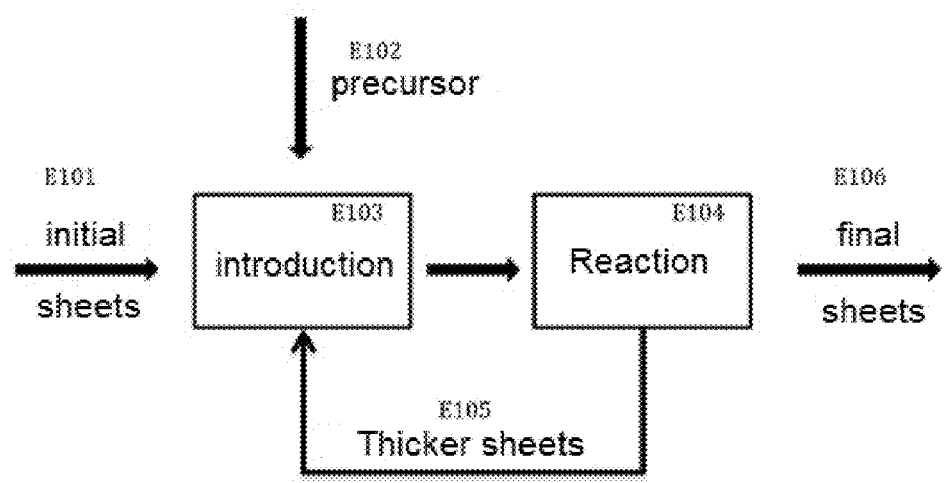
FIG. 1 shows a functional block diagram of steps of a method of growth in thickness according to an embodiment of the invention.

The process 'steps used are summarized in the block diagram presented in FIG. 1.

In a first embodiment of the invention the sulfur precursor comprises bis(trimethylsilyl) sulfide (TMS$_2$S). 2 mL of the CdSe sheets solution in chloroform are placed under magnetic stirring in a glove box under inert atmosphere (E101). 100 µL of bis(trimethylsilyl) sulfide (TMS$_2$S) are then injected into the solution containing the sheets (E103), inducing a color change and a rapid aggregation. The mixture is allowed to react for one hour at room temperature (E104). The solution is then centrifuged, the supernatant removed and the pellet washed twice with ethanol. The sheets making up the precipitate (E105) are thicker than the initial sheets, they present an additional monolayer of sulfur on each side of the initial CdSe. The precipitate (E105) is then dispersed in a few milliliters of hexane to which 10 mg of Cd(Acetate)$_2$(H$_2$O)$_2$ powder (E101) are added (E103). Under stirring, there is another color change, the reaction is allowed to proceed for one hour (E104). 200 µL of oleic acid are then added, the solution becomes clear. The final sheets (E106) are then precipitated with ethanol and suspended in hexane. This process allows the deposition of a monolayer of CdS layers on each side of the CdSe sheets.

In the second embodiment of the invention, the sulfur precursor comprises hydrogen sulfide H$_2$S. 2 ml of the CdSe sheets solution in CHCl$_3$ (E101) are placed under magnetic stirring in a glove box. 2 mmol of H$_2$S (48 mL) (E102) are bubbled (E103) in the solution. It changes color and becomes turbid immediately (E104). Aggregated sheets are precipitated by centrifugation, the supernatant is discarded and the precipitate is dispersed in hexane (E105). 10 mg of Cd(Acetate)$_2$(H$_2$O)$_2$ (E102) are added (E103), and cause a new change of color (E104). After one hour, 200 µL of oleic acid are added and the solution becomes clear, sign of the disaggregation of the sheets. The final sheets (E106) are then precipitated in ethanol, centrifuged and suspended in hexane. This process allows the deposition of a CdS monolayer on each side of the CdSe sheets.

In a third embodiment of the invention the sulfur precursor comprises ammonium sulfide. 2 mL of the CdSe sheets solution in CHCl$_3$ (E101) and 2 mL of aqueous tetramethylammonium hydroxide solution (100 mg/mL) were introduced into a vial. 100 µL of an aqueous solution of ammonium sulfide (20%, E102) are rapidly injected into the biphasic mixture (E103). The color of the organic phase containing the sheets changes immediately (E104). Under stirring, the sheets then transfer in a few minutes in the upper aqueous phase. The addition of 10 mL of ethanol breaks the biphasic mixture and induces aggregation of the sheets which are then precipitated by centrifugation. The supernatant is removed and the sheets suspended in distilled water (E105). 20 mg of Cd(Acetate)$_2$(H$_2$O)$_2$ ($_E$102) were added to the solution (E103), which causes an immediate change in color followed by the aggregation of sheets (E104). The final sheets (E106) are precipitated by centrifugation and dispersed in hexane using 200 µL oleic acid. This process allows the deposition of a CdS monolayer on each side of the CdSe sheets.

Figure 3:
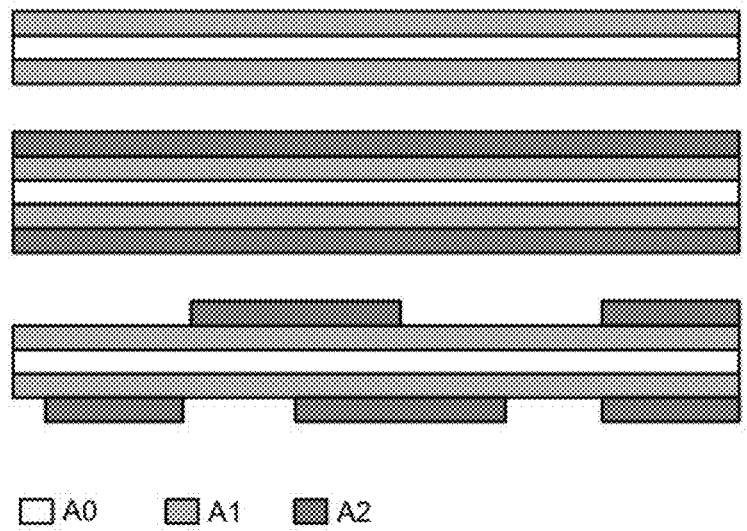
FIG. 3 shows the schematic structure of a heterostructured nanosheet seen in sectional view according to one embodiment of the invention.

The iteration of the process described in any of the embodiments above allows the deposit of additional layers. The final structure of the sheets obtained is shown schematically in FIG. 3, where A0 is the CdSe and A1 is the CdS. Replacement of Cd(Acetate)$_2$(H$_2$O)$_2$ by Zn(Acetate)$_2$(H$_2$O)$_2$ allows the deposition of a ZnS monolayer on the CdSe sheets.

Same processes can be used to deposit selenide or telluride instead of sulfide. In this case the precursor used may be the selenium or tellurium analog precursors than the one used above.

Deposition of a Film of Oxides on the Sheets.

One describes for example the deposition of a film of zinc oxide ZnO, according to one embodiment of the invention, on the initial CdSe sheets. 2 mL of the solution of CdSe sheets in CHCl$_3$ (E101) are introduced in a vial. 100 µL of a tetramethylammonium hydroxide solution (E102) in methanol are injected (E103). The color of the solution changes immediately from yellow to red and the sheets aggregate strongly (E104). The sheets (E105) are then precipitated by centrifugation and washed twice with ethanol. The sheets (E105) are then dispersed in chloroform and 10 mg of Zn(stearate)$_2$ (E101) are added. After 10 minutes of sonication (E104), the final sheets (E106) are precipitated with ethanol and dispersed in chloroform. The process allows the deposition of a ZnO monolayer on each side of the CdSe sheets. The final structure of the as-obtained sheets is schematized in FIG. 3, where A0 is CdSe, and A1 is ZnO.

Deposition of a Metallic Film

One describes for example the deposition of gold, according to one embodiment of the invention, on the initial CdSe nanosheets. These sheets have a positive surface charge and it is first of all necessary to invert it. This inversion is done by deposition of a monolayer of sulfur at the surface of the sheets.

2 mL of the solution of CdSe sheets in CHCl$_3$ (E101) as well as 100 µL of a solution of tetramethylammonium sulfide (1 M) in ethanol are introduced in a vial. Under stirring, the color of the solution containing the sheets changes immediately and the sheets aggregate. After 10 minutes of reaction, the sheets are precipitated by centrifugation. The supernatant is discarded and the sheets are washed twice with ethanol. The sheets are suspended in distilled water.

One then adds dropwise (E103) in the solution of sheets a solution of $HAuCl_4$ (E102) at 0.1 M. The color of the solution changes progressively due to the deposition of gold at the sheets' surface (E104). The final sheets (E106) are washed twice by precipitation with ethanol. The final structure of the as-obtained sheets is schematized in FIG. 3 where A0 is CdSe, and A1 is gold (Au).

According to another embodiment of the invention, one describes for example the deposition of a gold layer on initial nanosheets.

In a vial are successively added 2 mL of chloroform, 400 µL of the solution of CdSe sheets, 20 mg of thioacetamide (TAA) as well as 200 µL of octylamine. The solution is submitted to sonication for 5 minutes, which causes the complete dissolution of TAA as well as a color change from yellow to orange. The sheets are then aggregated by addition of a few drops of ethanol and the solution is centrifuged for 5 minutes at 5000 rpms. The supernatant containing the unreacted precursors is discarded and the pellet containing the sheets is dispersed in 2 mL of toluene. 2 mL of a solution of gold precursors and ligands prepared by dissolution in 10 mL of toluene of 10 mg of $AuCl_3$, 80 mg of didodecyldimethylammonium bromide as well as 120 mg of dodecylamine are added. The mixture is left reacting for 15 minutes. The resulting core/shell objects are precipitated by centrifugation for 5 minutes at 5000 rpms, the supernatant is discarded and the pellet dispersed in 2 mL of toluene.

Deposition of an Alloyed Film

One describes for example the deposition, according to one embodiment of the invention, of an alloy of cadmium sulfide and zinc sulfide CdZnS on the initial CdSe nanosheet.

2 mL of a CdSe sheets solution in chloroform (E101) is placed under magnetic stirring in a glove box under inert atmosphere. 100 µL of bis(trimethylsilyl) sulfide ($TMS_2S$) (E102) are then injected (E103), inducing a color change and a rapid aggregation. The mixture is allowed to react for one hour at room temperature (E104). The solution is then centrifuged, the supernatant discarded and the precipitate washed twice with ethanol. It is then dispersed in few milliliters of hexane (E105). A 5 mg of $Cd(Acetate)_2(H_2O)_2$ and 3.5 mg of $Zn(Acetate)_2$ solution (E102) dissolved in 1 mL of ethanol is added drop wise over 10 minutes (E103). A new color change is observed, the reaction is allows to proceed under stirring for one hour (E104). 200 µL of oleic acid are then added, the solution becomes clear. The final sheets (E106) are then precipitated with ethanol and suspended in hexane. The process allows the deposit of a $Cd_{0.5}Zn_{0.5}S$ monolayer on each side of CdSe sheets. The iteration of the process allows the deposition of additional layers. The final structure of the sheets obtained is shown schematically in FIG. 3, where A0 is the CdSe and A1 is the CdZnS.

Deposition of a Doped Film

One describes for example the deposition of a film of zinc sulfide doped with manganese on the initial CdSe sheets according to one embodiment of the invention.

2 mL of a CdS sheets solution in chloroform (E101) is placed in a vial under magnetic stirring in a glove box under inert atmosphere. 100 µL of bis(trimethylsilyl) sulfide ($TMS_2S$, E102) are then injected (E103), inducing a rapid aggregation. The mixture is allowed to react for one hour at room temperature (E104). The solution is then centrifuged, the supernatant discarded and the pellet washed twice with ethanol. It is then dispersed in few milliliters of hexane (E105). 1 mL of a $Zn(Acetate)_2$ and $Mn(Acetate)_2$ solution (1% molar in Mn) in ethanol (E102) is added drop wise over 10 minutes (E103). The reaction is allowed to proceed under stirring for one hour (E104). 200 µL of oleic acid are then added, the solution becomes clear. The final sheets (E106) are then precipitated with ethanol and suspended in hexane. The process allows the deposit of a manganese-doped ZnS monolayer on each side of CdS sheets. The iteration of the process allows the deposition of additional layers.

Successive Deposition of Several Films of Different Chemical Composition

One describes for example the deposition of a film of cadmium sulfide then of zinc sulfide on the initial CdSe nanosheets according to one embodiment of the invention.

2 mL of a CdSe sheets solution in chloroform (E101) is placed under magnetic stirring in a glove box under inert atmosphere. 100 µL of bis(trimethylsilyl) sulfide ($TMS_2S$, E102) are then injected (E103), inducing a color change and a rapid aggregation. The mixture is allowed to react for one hour at room temperature (E104). The solution is then centrifuged, the supernatant discarded and the precipitate washed twice with ethanol. This (E105) is then dispersed in few milliliters of hexane to which 10 mg of $Cd(Acetate)_2(H_2O)_2$ (E102) powder are added (E103). Under stirring, a new color change is observed, the reaction is allowed to proceed for one hour (E104). 200 µL of oleic acid are then added, the solution becomes clear. The sheets are then precipitated with ethanol and suspended in 2 mL of chloroform. We now have sheets covered with a CdS monolayer (E105). This solution is placed again under magnetic stirring in a glove box under inert atmosphere. 100 µL of bis (trimethylsilyl) sulfide ($TMS_2S$, E102) are then injected (E103), inducing a color change and a rapid aggregation. The mixture is allowed to react for one hour at room temperature (E104). The solution is then centrifuged, the supernatant discarded and the pellet washed twice with ethanol. This (E105) is then dispersed in few milliliters of hexane to which 10 mg of $Zn(Acetate)_2$ (E102) powder are added (E103). Under stirring, a new color change is observed. The reaction is allowed to proceed for one hour (E104). 200 µL of oleic acid are then added, the solution becomes clear. The final sheets (E106) are then precipitated with ethanol and suspended in hexane. The final structure of the sheets obtained is shown schematically in FIG. 3, where A0 is the CdSe, A1 is the CdS and A2 is the ZnS.

Immobilization of Sheets on a Substrate then Growth:

In one embodiment of the invention, a microscope glass slide (26 mm by 26 mm) is cleaned with an oxygen plasma. It is then functionalized with 3-mercaptopropyl-triethoxysilane by immersion for 10 minutes in a 1% in volume solution of 3-mercaptopropyl-triethoxysilane in ethanol. The glass slide is rinsed 3 times with ethanol then dried. It is then immersed for 1 h in a solution of CdSe sheets dispersed in chloroform. The sheets adsorb at the surface of the glass slide and form a monolayer of sheets. The slide is rinsed twice with chloroform in order to eliminate sheets that are not bound to the substrate.

Figure 4:
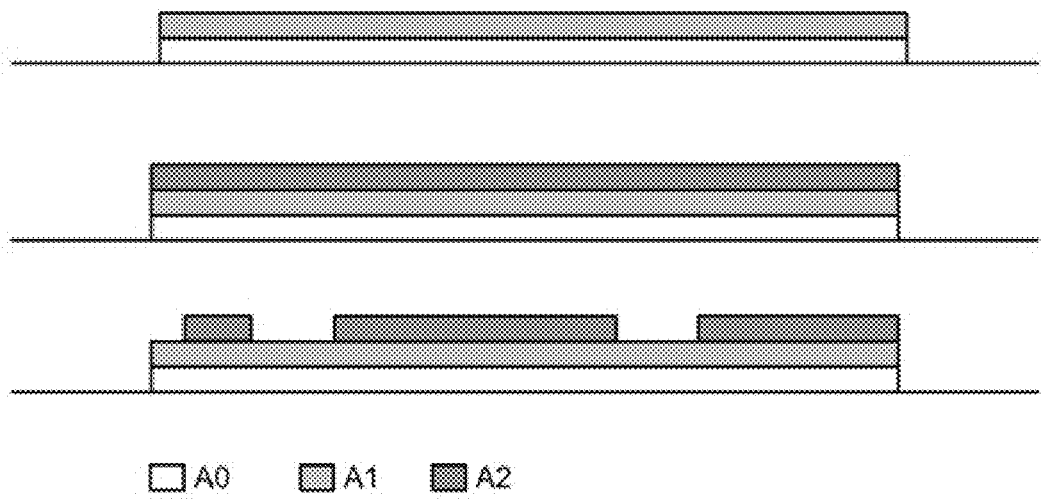
FIG. 4 shows the schematic structure of a heterostructured nanosheet obtained by growth after immobilization on a substrate seen in sectional view according to one embodiment of the invention.

One then deposits a monolayer of sulfur on the surface of sheets absorbed on the glass plate. The slide covered with sheets (E101) is placed in a glove box under inert atmosphere and immersed in chloroform. 10 µL bis(trimethylsilyl) sulfide ($TMS_2S$, E102) are then injected (E103). After hour of reaction (E104), the slide is rinsed twice with chloroform, then twice with ethanol. It is then possible to deposit a monolayer of cadmium to form a film of CdS. For this, the glass side covered with thicker sheets (E105) is immersed (E103) in a 0.1 M solution of $Cd(acetate)_2(H_2O)_2$ (E102) in ethanol and is allowed to react for one hours (E104). After two washes with ethanol, the glass slide is thus covered with a layer of CdSe/CdS sheets (E106). The final structure of sheets obtained on substrate is shown schematically in FIG. 4, where A0 is the CdSe and A1 is the CdS.

As obvious and as already resulting from the foregoing, the invention is in no way limited to those modes of applications and achievements that have been especially considered, it encompasses all variants without departing from the scope of the invention as defined by the claims.

BIBLIOGRAPHY (1) Ekimov, A. JETP Lett 1981, 34, 345-348.
(2) Alivisatos, A. P. Science 1996, 271, 933-937.
(3) Vassiliou, J.; Mehrotra, V.; Russell, M. J. Appl. Phys 1993, 5109-5116.
(4) El-Sayed, M. a Accounts of chemical research 2004, 37, 326-33.
(5) Ma, R.; Sasaki, T. Advanced materials 2010, 22, 5082-104.
(6) Sasaki, T.; Watanabe, M. The Journal of Physical Chemistry B 1997, 101, 10159-10161.
(7) Hernandez, Y.; Nicolosi, V.; Lotya, M.; Blighe, F. M.; Sun, Z.; De, S.; McGovern, I. T.; Holland, B.; Byrne, M.; Gun'Ko, Y. K.; Boland, J. J.; Niraj, P.; Duesberg, G.; Krishnamurthy, S.; Goodhue, R.; Hutchison, J.; Scardaci, V.; Ferrari, A. C.; Coleman, J. N. Nature nanotechnology 2008, 3, 563-8.
(8) Vaughn, D. D.; Patel, R. J.; Hickner, M. a; Schaak, R. E. Journal of the American Chemical Society 2010, 132, 15170-2.
(9) Mehta, R. J.; Karthik, C.; Singh, B.; Teki, R.; Borca-Tasciuc, T.; Ramanath, G. ACS nano 2010, 4, 5055-60.
(10) Kumar, S.; Nann, T. Small 2006, 2, 316-29.
(11) Jun, Y.-wook; Choi, J.-sil; Cheon, J. Angewandte Chemie (International ed. in English) 2006, 45, 3414-39.
(12) Xu, S.; Sun, X.; Ye, H.; You, T.; Song, X.; Sun, S. Materials Chemistry and Physics 2010, 120, 1-5.
(13) Li, C. C.; Cai, W. P.; Cao, B. Q.; Sun, F. Q.; Li, Y.; Kan, C. X.; Zhang, L. D. Advanced Functional Materials 2006, 16, 83-90.
(14) Sigman, M. B.; Ghezelbash, A.; Hanrath, T.; Saunders, A. E.; Lee, F.; Korgel, B. a Journal of the American Chemical Society 2003, 125, 16050-7.
(15) Deng, Z.; Mansuripur, M.; Muscat, A. J. Journal of Materials Chemistry 2009, 19, 6201.
(16) Puntes, V. F.; Zanchet, D.; Erdonmez, C. K.; Alivisatos, a P. Journal of the American Chemical Society 2002, 124, 12874-80.
(17) Si, R.; Zhang, Y.-W.; You, L.-P.; Yan, C.-H. Angewandte Chemie (International ed. in English) 2005, 44, 3256-60.
(18) Zhang, G.; Sun, S.; Li, R.; Zhang, Y.; Cai, M.; Sun, X. Chemistry of Materials 2010, 22, 4721-4727.
(19) Sun, Y.; Xia, Y. Science 2002, 298, 2176-9.
(20) Ah, C. S.; Yun, Y. J.; Park, H. J.; Kim, W.-J.; Ha, D. H.; Yun, W. S. Chemistry of Materials 2005, 17, 5558-5561.
(21) Huang, W. L.; Chen, C.-hua; Huang, M. H. The Journal of Physical Chemistry C 2007, 111, 2533-2538.
(22) Deng, Z.; Mansuipur, M.; Muscat, A. J. The Journal of Physical Chemistry C 2009, 113, 867-873.
(23) Yu, T.; Joo, J.; Park, Y. I.; Hyeon, T. Journal of the American Chemical Society 2006, 128, 1786-7.
(24) Xu, R.; Xie, T.; Zhao, Y.; Li, Y. Crystal Growth & Design 2007, 7, 1904-1911.
(25) Yu, J. C.; Xu, A.; Zhang, L.; Song, R.; Wu, L. The Journal of Physical Chemistry B 2004, 108, 64-70.
(26) Joo, J.; Son, J. S.; Kwon, S. G.; Yu, J. H.; Hyeon, T. Journal of the American Chemical Society 2006, 128, 5632-3.
(27) Yu, J. H.; Liu, X.; Kweon, K. E.; Joo, J.; Park, J.; Ko, K.-T.; Lee, D. W.; Shen, S.; Tivakornsasithorn, K.; Son, J. S.; Park, J.-H.; Kim, Y.-W.; Hwang, G. S.; Dobrowolska, M.; Furdyna, J. K.; Hyeon, T. Nature materials 2010, 9, 47-53.
(28) Yu, S. H.; Yoshimura, M. Advanced Materials 2002, 14, 296-300.
(29) Li, J.; Xu, Y.; Wu, D.; Sun, Y. Solid State Communications 2004, 130, 619-622.
(30) Yao, W.-T.; Yu, S.-H.; Pan, L.; Li, J.; Wu, Q.-S.; Zhang, L.; Jiang, J. Small 2005, 1, 320-5.
(31) Fan, L.; Song, H.; Zhao, H.; Pan, G.; Yu, H.; Bai, X.; Li, S.; Lei, Y.; Dai, Q.; Qin, R.; Wang, T.; Dong, B.; Zheng, Z.; Ren, X. The journal of physical chemistry. B 2006, 110, 12948-53.
(32) Park, K. H.; Jang, K.; Son, S. U. Angewandte Chemie (International ed. in English) 2006, 45, 4608-12.
(33) Han-Mei, H.; Chong-Hai, D.; Xian-Huai, H.; Yan, L.; Mei, S.; Ke-Hua, Z. CHINESE JOURNAL OF INORGANIC CHEMISTRY 2007, 23, 1403-1408.
(34) Huang, X.; Li, J. Journal of the American Chemical Society 2007, 129, 3157-62.
(35) Huang, X.; Li, J.; Zhang, Y.; Mascarenhas, A. Journal of the American Chemical Society 2003, 125, 7049-55.
(36) Son, J. S.; Wen, X.-D.; Joo, J.; Chae, J.; Baek, S.-I.; Park, K.; Kim, J. H.; An, K.; Yu, J. H.; Kwon, S. G.; Choi, S.-H.; Wang, Z.; Kim, Y.-W.; Kuk, Y.; Hoffmann, R.; Hyeon, T. Angewandte Chemie (International ed. in English) 2009, 48, 6861-4.
(37) Ithurria, S.; Dubertret, B. Journal of the American Chemical Society 2008, 130, 16504-5.
(38) Ithurria, S.; Bousquet, G.; Dubertret, B. Journal of the American Chemical Society 2011, 133, 3070-7.
(39) Li, Z.; Peng, X. Journal of the American Chemical Society 2011, 133, 6578-86.
(40) Hines, M. a; Guyot-Sionnest, P. The Journal of Physical Chemistry 1996, 100, 468-471.
(41) Peng, X. Chemistry 2002, 8, 334-9.
(42) Trindade, T.; O'Brien, P.; Zhang, X.-mei Chemistry of Materials 1997, 9, 523-530.
(43) Mane, R. Materials Chemistry and Physics 2000, 65, 1-31.
(44) Nicolau, Y. Applications of Surface Science 1985, 22, 1061-1074.

The invention claimed is:

1. An inorganic colloidal nanoparticle comprising an initial inorganic nanosheet partially or totally covered with at least one monolayer of inorganic material, wherein the initial inorganic nanosheet is an inorganic colloidal nanosheet, wherein the inorganic colloidal nanoparticle has a thickness of 0.5 nm to 10 mm, wherein the initial inorganic nanosheet comprises a material $M_xE_y$, wherein: M is Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, or a mixture thereof, E is O, S, Se, Te, N, P, As, F, Cl, Br, I, or a mixture thereof, and x and y are independently a decimal number from 0 to 5, and wherein the initial inorganic nanosheet is partially or totally covered by a monolayer of a material M or E wherein: M is Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, or a mixture thereof, and E is O, S, Se, Te, N, P, As, F, Cl, Br, I, or a mixture thereof.

2. The inorganic collodial nanoparticle according to claim 1, whose lateral dimensions are at least 1.5 times its thickness.

3. The inorganic collodial nanoparticle according to claim 1, wherein the initial inorganic nanosheet is partially or totally covered by at least two monolayers, where the monolayers are alternatively composed of M then E or conversely, wherein M is Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, or a mixture thereof, and E is O, S, Se, Te, N, P, As, F, Cl, Br, I, or a mixture thereof.

4. The inorganic colloidal nanoparticle according to claim 1, wherein the inorganic colloidal nanoparticle has a core/shell structure.

5. A product comprising at least one inorganic colloidal nanoparticle according to claim 1, wherein the product is a luminescent system, an electroluminescent system, an amplifying stage of a laser, a catalyst, a photovoltaic cell, or a transistor.

\* \* \* \* \*